(12) United States Patent
Imai (10) Patent No.: US 7,528,487 B2
(45) Date of Patent: May 5, 2009

(54) SEMICONDUCTOR DEVICE HAVING INSULATING MATERIAL DISPERSED WITH CONDUCTIVE PARTICLES WHICH ESTABLISH ELECTRICAL CONNECTION BY PENETRATING TO BOTH COPPER CONDUCTIVE LAYER AND LAND OF WIRING BOARD

(75) Inventor: Hideo Imai, Shimosuwa-machi (JP)

(73) Assignee: Seiko Epson Corporation (JP)

( * ) Notice: Subject to any disclaimer, the term of this patent is extended or adjusted under 35 U.S.C. 154(b) by 91 days.

(21) Appl. No.: 11/000,516

(22) Filed: Nov. 30, 2004

(65) Prior Publication Data
US 2005/0127504 A1    Jun. 16, 2005

(30) Foreign Application Priority Data
Dec. 5, 2003    (JP)    ............... 2003-407386
Oct. 20, 2004   (JP)    ............... 2004-305519

(51) Int. Cl.
*H01L 23/52* (2006.01)
*H01L 23/48* (2006.01)
*H01L 23/40* (2006.01)
*H01L 23/485* (2006.01)
*H01L 23/498* (2006.01)

(52) U.S. Cl. ................ 257/737; 257/738; 257/750; 257/780; 257/781; 257/E23.021; 257/E23.069

(58) Field of Classification Search ........... 257/737, 257/738, 750, 780, 781, E23.021, E23.069
See application file for complete search history.

(56) References Cited

U.S. PATENT DOCUMENTS

| | | | | |
|---|---|---|---|---|
| 4,042,954 | A | * | 8/1977 | Harris .................. 257/737 |
| 5,290,732 | A | * | 3/1994 | Kumar et al. ............. 216/13 |
| 5,918,113 | A | * | 6/1999 | Higashi et al. ........... 438/119 |
| 5,925,930 | A | * | 7/1999 | Farnworth et al. ......... 257/737 |
| 6,223,429 | B1 | * | 5/2001 | Kaneda et al. ............ 29/832 |
| 6,232,563 | B1 | | 5/2001 | Kim et al. |
| 2002/0105078 | A1 | | 8/2002 | Lee et al. |
| 2003/0127730 | A1 | | 7/2003 | Weng |
| 2005/0212130 | A1 | * | 9/2005 | Imai .................... 257/737 |

FOREIGN PATENT DOCUMENTS

| | | |
|---|---|---|
| JP | 04-318935 | 11/1992 |
| JP | 2000-286299 | 10/2000 |
| JP | 2002-158248 | 5/2002 |
| JP | 2003-297868 | 10/2003 |
| JP | 2004-273957 | 9/2004 |

* cited by examiner

*Primary Examiner*—Luan C Thai
(74) *Attorney, Agent, or Firm*—Harness, Dickey & Pierce, P.L.C.

(57) ABSTRACT

A semiconductor device including: a semiconductor chip including a substrate, an outer-connection electrode, and a bump, wherein the bump has a first conductive layer and a second conductive layer provided on the first conductive layer, and the second conductive layer is made of copper; a wiring board having a land; and an insulating material dispersed with conductive particles, wherein the conductive particles connect between the bump and the land, wherein an electrical connection is established by the conductive particles having penetrated to both the second conductive layer and the land.

10 Claims, 5 Drawing Sheets

SEMICONDUCTOR DEVICE HAVING INSULATING MATERIAL DISPERSED WITH CONDUCTIVE PARTICLES WHICH ESTABLISH ELECTRICAL CONNECTION BY PENETRATING TO BOTH COPPER CONDUCTIVE LAYER AND LAND OF WIRING BOARD

BACKGROUND OF THE INVENTION

1. Field of the Invention

The present invention relates to a semiconductor device, to a semiconductor chip, to a method for manufacturing a semiconductor device, and to an electronic apparatus, and particularly to a semiconductor chip which is tailored to flip-chip mounting technique.

Priority is claimed on Japanese Patent Application No. 2003-407386, filed Dec. 5, 2003, and Japanese Patent Application No. 2004-305519, filed Oct. 20, 2004, the contents of which are incorporated herein by reference.

2. Description of Related Art

At present, there is a strong demand to reduce the size, width, and weight, and manufacturing cost of mobile electronic apparatuses, such as portable phones and notebook-type personal computers. In order to meet such a demand, higher integration of semiconductor chips used in various electronic apparatuses has been considered, and various semiconductor mounting techniques have been researched and developed.

As a technique for mounting semiconductor chips which is effective and is capable of reliably being molded with a resin, the flip-chip mounting technique has been proposed, as disclosed in, for example, Japanese Unexamined Patent Application, First Publication No. 2000-286299. In this method, bumps made of nickel and gold are provided on a semiconductor chip, and the semiconductor chip and a wiring board are electrically connected via an anisotropic conductive resin layer.

This technique, however, has a problem. In order to ensure a good electrical connection with the wiring board, the conductive particles contained in the anisotropic conductive resin layer need to penetrate to the gold layer which forms the surface of bumps provided on the semiconductor chip. Thus, a further cost reduction cannot be achieved since it is necessary to form a gold layer having a sufficient thickness.

SUMMARY OF THE INVENTION

The present invention was conceived in view of the above-described shortcoming, and an object thereof is to provide a highly reliable semiconductor device and semiconductor chip which can be manufactured at a lower cost and is capable of ensuring a good electrical connection, to provide a method for manufacturing a semiconductor device, to and an electronic apparatus having the semiconductor device.

In order to solve the above-described problem, a semiconductor device according to the present invention includes a semiconductor chip including a substrate, an outer-connection electrode, and a bump, wherein the bump has a first conductive layer and a second conductive layer provided on the first conductive layer, and the second conductive layer is made of copper; a wiring board having a land; and an insulating material dispersed with conductive particles, wherein the conductive particles connect between the bump and the land, wherein an electrical connection is established by the conductive particles having penetrated to both the second conductive layer and the land.

In the above-described semiconductor device, since the conductive particles penetrate to copper in the second conductive layer instead of conductive particles merely contacting the second conductive layer, a large contact area is guaranteed and a low-resistance electrical connection can be provided. Furthermore, the electrical connection between the second conductive layer and the conductive particle becomes resistant to the expansion and shrinkage of the insulating material caused by a temperature variation, or vibration, or the like. Thus, a semiconductor device having a reliable electrical connection can be provided at a lower cost. Furthermore, in this semiconductor device, since the conductive particles are securely sandwiched between copper in the surface layer of the bump and the land on the wiring board, a stable electrical connection is guaranteed. Thus, a semiconductor device having a reliable electrical connection can be provided at a lower cost.

In the above-described semiconductor device, the thickness of the second conductive layer is preferably selected so that a depth of penetration of the conductive particles to the second conductive layer is sufficient to establish an electrical connection. For example, the thickness of the second conductive layer may be selected so that a depth of penetration of the conductive particles to the second conductive layer is a quarter or more of a particle size of the conductive particles. The bump on the semiconductor chip and the land on the wiring board generally have irregular surfaces, not smooth ones. If the depth of penetration of the conductive particles to the second conductive layer were less than a quarter of the particle size of the conductive particles, a good electrical connection would not be established because the contact area would be smaller due to distribution of irregularities. In contrast, if the depth of penetration of the conductive particles to the second conductive layer is a quarter or more of the particle size of the conductive particles, a large contact area is guaranteed and the effect of the irregularity is mitigated. Thus, a good electrical connection can be established with the land on the wiring board, and the reliability of the device improves.

In the above-described semiconductor device, the thickness of the second conductive layer may be selected so that a depth of penetration of the conductive particles to the second conductive layer is a half or more of a particle size of the conductive particles so that the bump and the land directly contact. Since the conductive particles are securely sandwiched between the second conductive layer and the land on the wiring board, a stable electrical connection is guaranteed. Thus, a good electrical connection can be established and the reliability of the device improves.

In the above-described semiconductor device, a catalyst may be disposed between the first conductive layer and the second conductive layer. In some cases in which a certain combination of materials are used for the first conductive layer and the second conductive layer, a close adhesion between the first conductive layer and the second conductive layer may not be obtained. In some cases, problems, such as peeling-off of the second conductive layer, may arise. When a catalyst is provided between the first conductive layer and the second conductive layer, it is possible to improve the adhesion between the first conductive layer and the second conductive layer by properly selecting the catalyst.

The above-described semiconductor device may further include a passivation film which is formed on the substrate and has an opening in the outer-connection electrode. The first conductive layer may be formed within the opening, and has a thickness of equal to or less than a thickness of the passivation film. In other words, the first conductive layer may be formed only within the opening provided in the passivation film. If a first conductive layer made of a hard material were formed also on the passivation film, the passivation film would crack due to a stress concentrated on the passivation film when the semiconductor chip is mounted on the wiring board by applying a pressure to the semiconductor chip. In contrast, if the first conductive layer is formed only within the opening provided in the passivation film, only the second conductive layer made of copper is provided on the passivation film. Thus, flexibility of the copper can help relieve the stress imposed on the passivation film when the semiconductor chip is mounted on the wiring board by applying a pressure to the semiconductor chip. Therefore, damage, such as cracking in the passivation film, can be prevented, and a highly reliable semiconductor chip can be realized.

In the above-described semiconductor device, the first conductive layer may be made of a material having the same hardness as that of the conductive particles or a higher hardness than that of the conductive particles. Furthermore, the conductive particles may contain a material having a higher hardness than that of copper of which the second conductive layer is made. In this arrangement, since the conductive particles do not penetrate to the first conductive layer but to the second conductive layer, the conductive particles are prevented from being completely buried into the bump. Thus, the reliability of the electrical connection is improved.

The present invention is directed to a semiconductor chip including: a substrate; an outer-connection electrode formed on the substrate; a bump which electrically connects to the outer-connection electrode and includes a first conductive layer and a second conductive layer provided on the first conductive layer, wherein the second conductive layer is made of copper; and a passivation film having an opening on the outer-connection electrode, wherein the first conductive layer contacts a front surface of the outer-connection electrode within the opening provided in the passivation film, and does not contact the front surface of the passivation film.

If a first conductive layer made of a hard material, for example, nickel, were formed also on the passivation film, the passivation film would crack due to a stress concentrated on the passivation film when the semiconductor chip is mounted on the wiring board by applying a pressure to the semiconductor chip. In contrast, if the first conductive layer is formed only within the opening provided in the passivation film so that the first conductive layer does not contact a front surface of the passivation film, only the second conductive layer made of copper is provided on the passivation film. Thus, flexibility of the copper can help relieve the stress imposed on the passivation film semiconductor chip when the semiconductor chip is mounted on the wiring board by applying a pressure to the semiconductor chip. Therefore, damage, such as cracking in the passivation film, can be prevented, and a highly reliable semiconductor chip can be realized.

In the above-described semiconductor chip, a catalyst may be disposed between the first conductive layer and the second conductive layer. The catalyst can improve the adhesion between the first conductive layer and the second conductive layer. As the catalyst, palladium may be used, for example.

In the above-described semiconductor chip, the thickness of the outer-connection electrode within the opening provided in the passivation film may be 0.2 µm or more. The outer-connection electrode having a sufficient thickness can reduce damage to the substrate which is located below the outer-connection electrode during bonding.

In the above-described semiconductor chip, a third conductive layer which is softer than the first conductive layer may be provided between the first conductive layer and the second conductive layer. The third conductive layer may reduce damage to the substrate which is located below the outer-connection electrodes during bonding.

The present invention is directed to a method for manufacturing a semiconductor device including a semiconductor chip having a bump and a wiring board having a land, the bump includes a first conductive layer, including the steps of: providing a second conductive layer made of copper on the first conductive layer, wherein the second conductive layer forms a part of the bump; disposing a insulating material dispersed with conductive particles between the bump having the second conductive layer and the land; and pressing the bump against the land so that the conductive particles penetrate to both the second conductive layer and the land so as to electrically connect between the bump and the land.

In the semiconductor device manufactured by the above-described manufacturing method, since the conductive particles are securely sandwiched between the land on the wiring board and copper in the surface layer of the bump, a stable electronic connection may be maintained. Thus, according to the method for manufacturing a semiconductor device of the present invention, a semiconductor chip having a reliable electrical connection can be provided at a lower cost.

The above-described method for manufacturing a semiconductor device may further include the step of disposing a catalyst between the first conductive layer and the second conductive layer. The adhesion between the first conductive layer and the second conductive layer can be improved by properly selecting the catalyst.

In the above-described method for manufacturing a semiconductor device, at least one of the first conductive layer and the second conductive layer may be formed using an electroless plating. Since it is possible to form the bumps with a smaller variation of the height using electroless plating, a highly reliable semiconductor device can be provided at a lower cost.

An electronic apparatus according to the present invention includes the above-described semiconductor device, which can provide a highly reliable electronic device apparatus a lower cost.

DETAILED DESCRIPTION OF THE INVENTION

Hereafter, various embodiments of the present invention will be described with reference to the drawings. It should be noted that these embodiments do not limit the scope of the present invention defined in the claims. Also, not all of the elements in the embodiments are not essential to the subject matters defined in the claims.

First Embodiment

Figure 2:
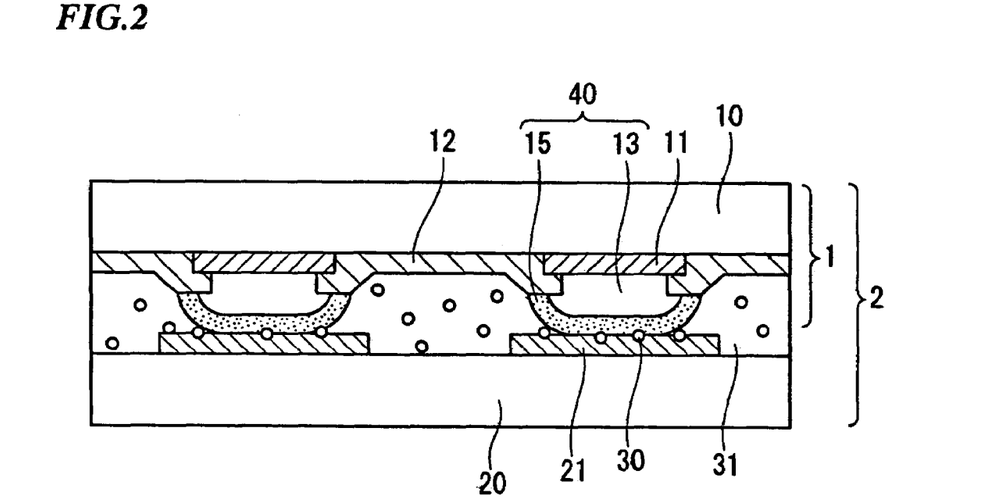
FIG. 2 is a schematic cross-sectional view schematically illustrating a semiconductor device according to a first embodiment of the present invention.

FIG. 2 is a schematic cross-sectional view which schematically illustrates a semiconductor device according to a first embodiment.

A semiconductor device 2 includes a semiconductor chip 1, a wiring board 20 provided with a plurality of lands 21, and an anisotropic conductive resin layer 31 which is dispersed with conductive particles 30.

Figure 1:
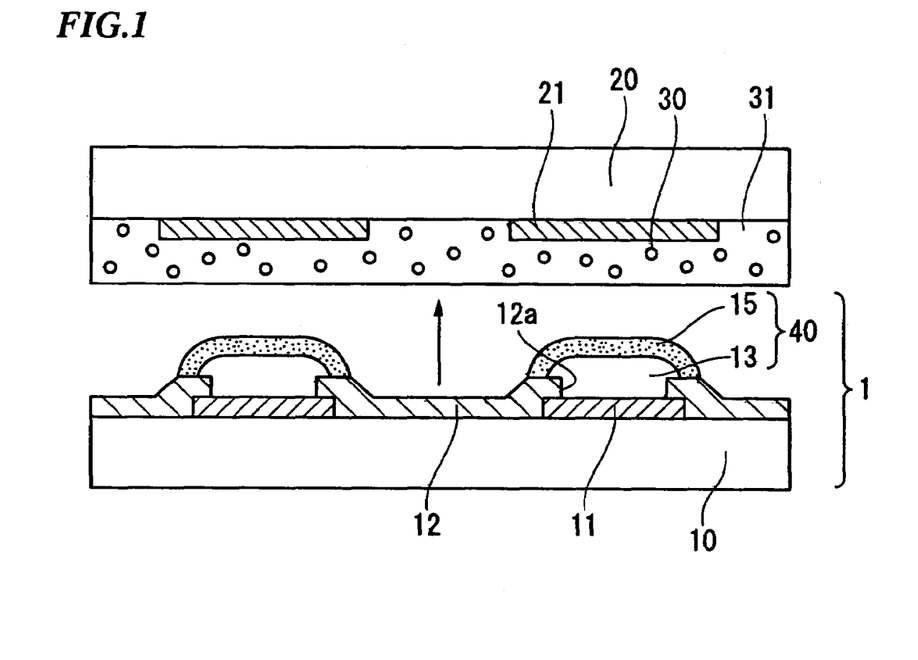
FIG. 1 is a schematic cross-sectional view schematically illustrating a semiconductor chip according to a first embodiment of the present invention.

FIG. 1 is a schematic cross-sectional view which schematically illustrates a semiconductor chip according to the first embodiment.

The semiconductor chip 1 includes a plurality of outer-connection electrodes 11 provided on one side of a substrate 10 made of, for example, silicon, and bumps 40 having a first conductive layer 13 and a second conductive layer 15 which are stacked together. The first conductive layer 13 is made of, for example, nickel and has a thickness ranging from 10 μm to 25 μm, preferably about 15 μm. The second conductive layer 15 is made of copper and has a thickness of about 5 μm. The outer-connection electrodes 11 are electrodes which are electrically connected to an integrated circuit (not shown) that has been formed on or in the substrate 10, and are made of aluminum or copper.

Furthermore, on the side of the substrate 10 on which the outer-connection electrodes 11 are disposed, a passivation film 12 made of silicon oxide is formed. Openings 12a are provided in the passivation film 12 so that portions of the outer-connection electrodes 11 are exposed. An opening 12a is defined so that the center of an outer-connection electrode 11 is exposed. In this case, the edge of the outer-connection electrode 11 is covered by a portion of the passivation film. In other words, on the side of the substrate 10 on which the outer-connection electrodes 11 are disposed, at least a part of an outer-connection electrode 11 is exposed, and the rest of the outer-connection electrode 11 is covered with the passivation film 12.

A catalyst (not shown) made of, for example, palladium, is disposed between the first conductive layer 13 and the second conductive layer 15. This catalyst helps to enhance an adhesion between the first conductive layer 13 made of nickel and the second conductive layer 15 made of copper so as to improve reliability of interconnection.

The wiring board 20 may be, but is not limited to, a flexible substrate made of, for example, polyimide resin, polyester film and the like. The wiring board 20 may be a rigid substrate, such as a glass epoxy substrate or a ceramic substrate. Lands 21 are conductive layers which may be made of, for example, copper, or may be made of silver which has a low electric resistivity comparable to copper.

The anisotropic conductive resin layer 31 is made of thermosetting resin, e.g., epoxy resin, and is sandwiched between one side of the semiconductor chip 1 on which bumps 40 are disposed and one side of the wiring board 20 on which the lands 21 are provided in order to seal and bond the semiconductor chip 1 and the wiring board 20. The conductive particles 30 are made from a material, such as nickel, having a higher hardness than that of copper of which the second conductive layer 15 is made. The conductive particles 30 have a particle size ranging from 0.2 μm to 5 μm, preferably a particle size of about 4 μm. As use herein, the term "the particle size of the conductive particles" refers to the particle size of the conductive particles.

The second conductive layer 15 which is the outermost layer of a bump 40 contacts a land 21. The conductive particles 30 which are sandwiched between the second conductive layer 15 and the land 21 penetrate to both the second conductive layer 15 and the land 21. In other words, when conductive particles 30 are sandwiched between a bump 40 and a land 21, the conductive particles 31 which are made of nickel penetrate to and are trapped in the second conductive layer 15 which is made of copper because nickel is harder than copper. The thickness of the second conductive layer 15 is selected such that the conductive particles 30 penetrate to the second conductive layer 15 to establish an electrical connection. The depth of penetration of the conductive particles to the second conductive layer 15 is set to about 5 μm so that the depth of penetration is at least a quarter or more of the particle size of the conductive particles 30, which is 1 μm or more in this embodiment. As use herein, the term "the depth of penetration of the conductive particles" refers to the average distance of penetration of the conductive particles into the second conductive layer. If conductive particles 30 are sandwiched between a bump 40 and a land 21 while the bump 40 and the land 21 directly contact, it is possible to make the conductive particles 30 penetrated to the second conductive layer 15 with a penetration depth of a half or more of the particle size of the conductive particles 30, which is a depth of penetration of 2 μm or more in this embodiment. Thus, the bump 40 and the lands 21 are electrically connected via the conductive particles 30.

It should be noted that the first conductive layer 13 may be made of a material as hard as the conductive particles 30 or may even have a higher hardness than the conductive particles 30. This prevents conductive particles 30 from being completely buried into a bump 40, and reliability of the electrical connection is improved.

As follows, a manufacturing process of the semiconductor device 2 shown in FIG. 2 will be explained. FIGS. 3A to 3F are schematic cross-sectional views of the manufacturing process of the semiconductor device 2. In the drawings, only elements which are relevant to the present invention are shown.

Figure 3A:
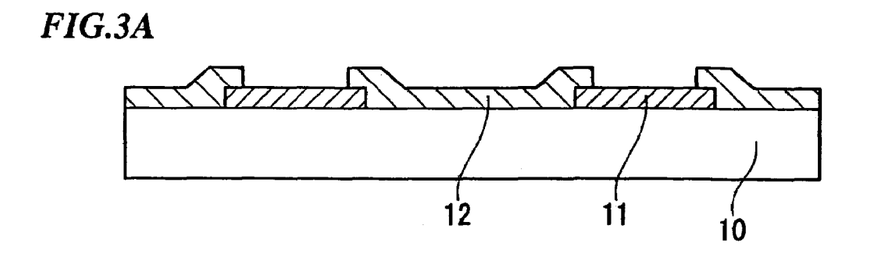
FIGS. 3A to 3F are schematic cross-sectional views illustrating one example of a manufacturing steps of the semiconductor device shown in FIG. 2.

As shown in FIG. 3A, a substrate 10 made of silicon or the like on which an integrated circuit (not shown) has been formed is provided. The substrate 10 includes a plurality of outer-connection electrodes 11. The outer-connection electrodes 11 are electrodes which electrically connect to the integrated circuit which has been formed on the substrate 10, and are made of aluminum or copper or the like.

Next, the passivation film 12 is deposited on the side of the substrate 10 on which the outer-connection electrodes are provided. The passivation film 12 is made of, for example, a film made of oxide or nitride of silicon which is the material of the substrate 10 ($SiO_2$ or SiN), a polyimide resin, or the like.

Figure 3B:
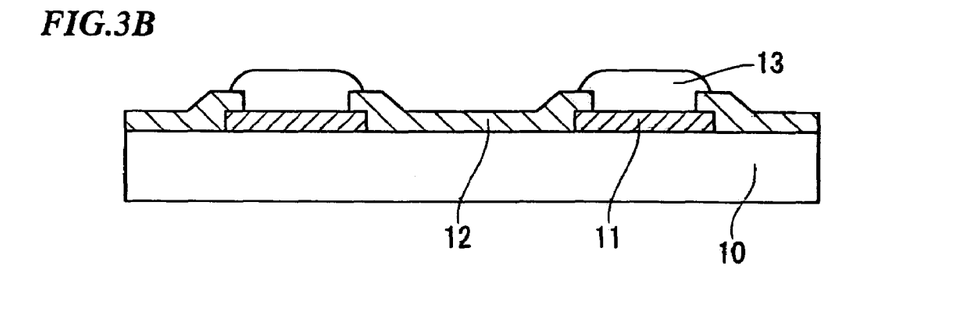

Next, the steps of forming a bump on each of the outer-connection electrodes 11 will be explained. As shown in FIG. 3B, when the outer-connection electrodes 11 are made of aluminum, the outer-connection electrodes 11 are subjected to a zincate treatment to electrolitically replace the aluminum on the surface with zinc to form a metal coating made of zinc (not shown). The first conductive layer 13 is then formed on the outer-connection electrodes 11. This first conductive layer is made of, for example, nickel, and may be formed using electroless plating. In other words, the outer-connection electrodes 11 which have been subjected to zincate treatment are immersed into an electroless nickel plating solution to cause a substitution reaction in which the zinc metal coating is substituted with nickel, thus nickel is deposited. The thickness of the first conductive layer is, for example, about from 10 μm to about 25 μm, and is preferably about 15 μm. In this embodiment, mushroom-shaped bumps are provided and the conductive layer is formed without using a mask. It should be noted, however, that straight wall-type bumps may be formed using a mask having a resist layer.

Next, a catalyst is disposed on the first conductive layer 13. The catalyst may be palladium, for example. In order to dispose palladium, sensitizing-activation method or catalyst-accelerator method may be employed.

Figure 3C:
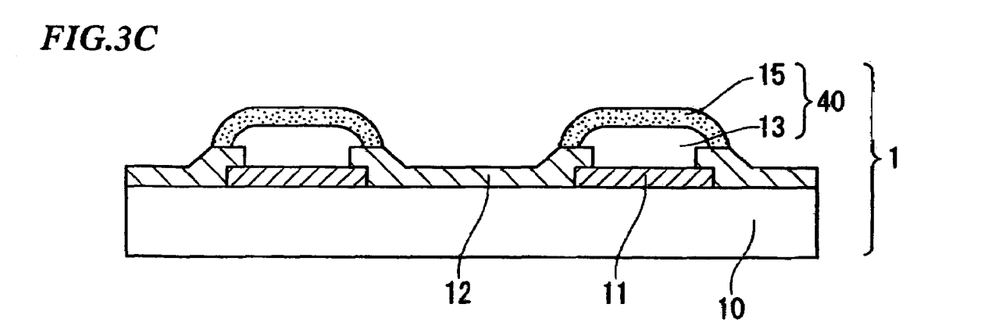

Next, as shown in FIG. 3C, the second conductive layer 15 is formed. The second conductive layer 15 is made of, for example, copper, and may be formed using electroless plating. Specifically, the first conductive layer 13 is immersed into a copper plating solution. The palladium disposed on the first conductive layer 13 functions as catalyst and copper is precipitated. The thickness of the second conductive layer 15 is preferably about 5 μm. The catalyst can improve the adhesion between the first conductive layer and the second conductive layer.

In the steps described above, a bump including the first conductive layer 13 and the second conductive layer 15 is formed on each of the outer-connection electrodes 11, and thus, the semiconductor chip 1 is fabricated.

Figure 3D:
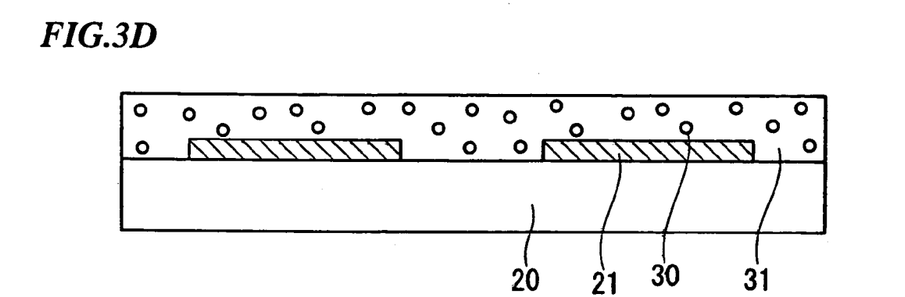

Next, as shown in FIG. 3D, a wiring board 20 is provided, and a plurality of lands 21 are provided on one surface thereof. An anisotropic conductive resin layer 31 is provided on the wiring board 20 on the surface the lands 21 have been provided. The wiring board 20, may be, but is not limited to, a flexible substrate made of, for example, polyimide resin, polyester film and the like. The wiring board 20 may be a rigid substrate, such as a glass epoxy substrate or a ceramic substrate. Lands 21 are conductive layers which may be made of, for example, copper, or may be made of silver which has a low electric resistivity comparable to copper.

The anisotropic conductive resin layer 31 is made from a paste-like epoxy resin, for example, thermosetting resin, and has adhesion property. The anisotropic conductive resin layer 31 is provided on the wiring board 20 using screen printing or dispensing method. It should be noted that the anisotropic conductive resin 31 may be formed by applying a resin film on the wiring board 20. In the anisotropic conductive resin layer 31, a plurality of the conductive particles are dispersed.

Figure 3E:
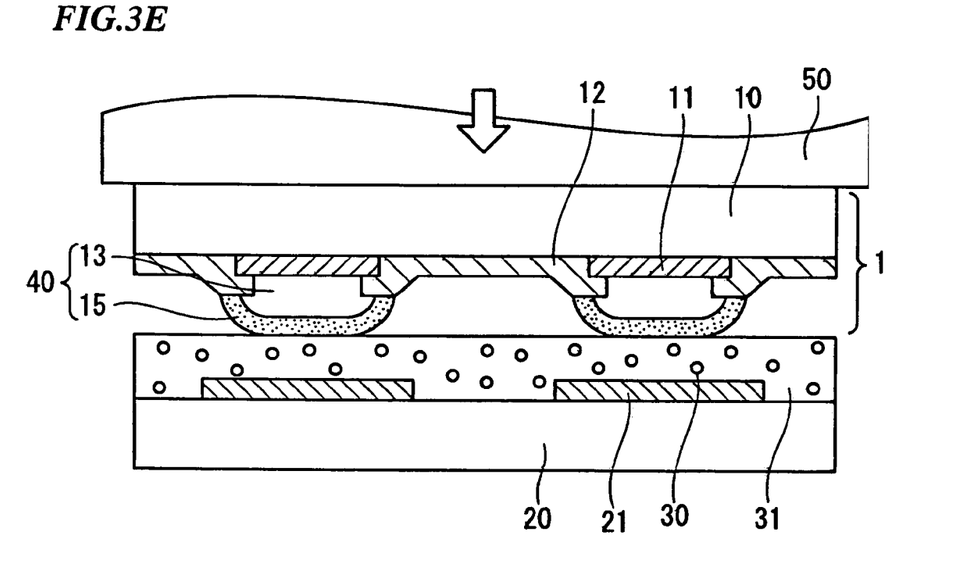

Then, as shown in FIG. 3E, the semiconductor chip 1 shown in FIG. 3C is turned upside down, and is positioned opposing the wiring board 20 provided with the anisotropic conductive resin layer 31. Specifically, a bump 40 is positioned opposing a land 21 on the wiring board 20 with which an electrical connection is to be established, and the semiconductor chip 1 is temporary adhered to the anisotropic conductive resin layer by means of the adhesion property of the anisotropic conductive resin layer. A thermo-compression tool 50 having a flat pressurizing surface is heated to the curing temperature of the anisotropic conductive resin layer 31. While placing the flat pressurizing surface of the thermo-compression tool 50 in parallel to the wiring board 20, pressure is applied to the flat pressurizing surface so that the semiconductor chip 1 is pressed against the wiring board 20.

Figure 3F:
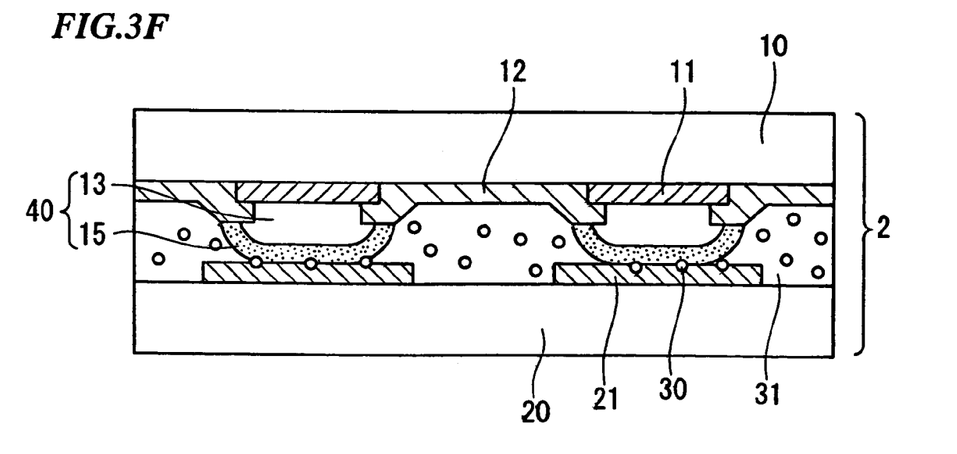

As a result, as shown in FIG. 3F, the anisotropic conductive resin 31 is displaced by the bump 40 until the bump 40 contacts the lands 21 provided on the wiring board 20. Conductive particles 30 contained in the anisotropic conductive resin layer 31 are sandwiched between the second conductive layer 15, which is the outermost layer of the bump 40, and the lands 21. Since the conductive particles 30 have a greater hardness than the second conductive layer 15 made of copper, the conductive particles 30 penetrate to the second conductive layer 15. The depth of penetration the conductive particles 30 to the second conductive layer 15 is set to at least a quarter or more of the particle size of the conductive particles 30, e.g., a depth of penetration about 1 μm. If conductive particles 30 are sandwiched between a bump 40 and a land 21 while the bump 40 and the land 21 directly contact, it is possible to penetrate the conductive particles 30 to the second conductive layer 15 with a penetration depth of a half or more of the particle size of the conductive particles 30, which is a depth of penetration of 2 μm or more in this embodiment. At the same time, the conductive particles 30 penetrate to the lands 21 made of copper or silver. As a result, it is possible to establish an electrical connection between the bump 40 and the land 21 which has a low contact resistance and is highly reliable and is resistant to expansion or shrinkage of the resin due to temperature variation, or vibration.

It should be noted that, in this embodiment, when the semiconductor chip 1 is vertically pressed against the wiring board 20 and pressure is applied, microvibration generated by ultrasonic shaking may be applied. This makes the conductive particles 30 easily cut into the second conductive layer 15 made of copper and an oxidation film formed on the surface of the lands 21, ensuring a better electrical connection.

Then, the anisotropic conductive resin layer 31 is thermo-cured while maintaining the electrical connection between the bump 40 and the land 21 to seal and bond the semiconductor chip 1 and the wiring board 20.

As described above, according to this embodiment, since conductive particles 30 penetrate both the second conductive layer 15 made of copper and the lands 21 provided on the wiring board 20, the contact area increases, which provides a low-resistance electrical connection. Furthermore, since the conductive particles 30 are sandwiched between bump 40 and the lands 21 provided on the wiring board 20, the interconnection becomes resistant to the expansion and shrinkage of the insulating material caused by a temperature variation, or vibration, or the like. Thus, a semiconductor chip having a good electrical connection can be provided at a lower cost. Furthermore, since the bump 40 can be formed using electroless plating, the bumps with a smaller variation of the height can be manufactured.

Second Embodiment

Figure 4:
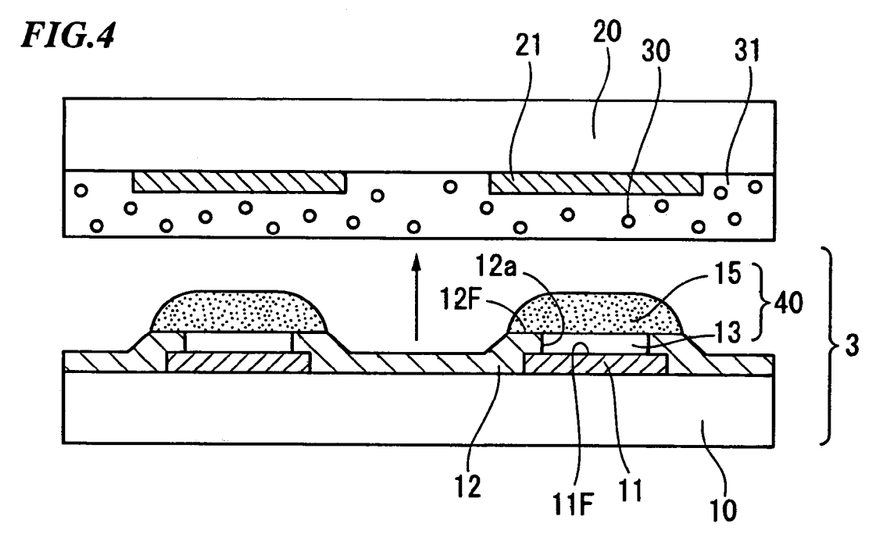
FIG. 4 is a schematic cross-sectional view schematically illustrating a semiconductor chip according to a second embodiment of the present invention.

Next, a second embodiment of a semiconductor chip according to the present invention will be described. FIG. 4 is a schematic cross-sectional view schematically illustrating the second embodiment of the semiconductor chip, which corresponds to the first embodiment shown in FIG. 1. A semiconductor chip 3 of the second embodiment includes a bump 40 which includes a first conductive layer 13 and a second conductive layer 15, and a bump 40 is provided on each of a plurality of outer-connection electrodes 11 disposed on one side of a substrate 10 which is made of silicon. The second embodiment differs from the first embodiment in that the first conductive layer 13 is provided in an opening 12a provided in a passivation film 12, and the first conductive layer 13 has a thickness equal to or smaller than the thickness of the passivation film 12. In other words, the first conductive layer 13 is provided only in the opening 12a of the passivation film 12. The first conductive layer 13 contacts a front surface 11F of the outer-connection electrodes 11 within the opening 12a of the passivation film 12, and does not contact the front surface. In this drawing, the same reference numerals denote the corresponding elements shown in FIG. 1, and explanation thereof will be omitted.

The passivation film 12 is a film made of, for example, an oxide of silicon, and has a thickness ranging from 1 μm to 3 μm, preferably about 1.5 μm. The first conductive layer 13 is made of, for example, nickel, and electrically connects to an outer-connection electrode 11. The thickness of the first conductive layer 13 may be any value equal to or smaller than the thickness of the passivation film 12. The thickness of the first conductive layer 13 preferably is about 1.5 μm which is the thickness of the passivation film so that the first conductive layer 13 and the passivation film 12 surrounding the first conductive layer 13 is in the same plane.

According to this embodiment, since only the second conductive layer 15 made of copper is formed on the front surface 12F of the passivation film 12, the stress applied to the passivation film 12 is relaxed by the flexibility of copper when the semiconductor chip 2 is mounted on the wiring board 20 by applying pressure to the semiconductor chip 2. Therefore, damage, such as cracking in the passivation film 12, can be prevented, and a highly reliable semiconductor chip can be realized.

Again in this embodiment, a catalyst (not shown) made of, for example, palladium is disposed between the first conductive layer and the second conductive layer 15. The catalyst can enhance the adhesion between the first conductive layer 13 made of nickel and the second conductive layer 15 made of copper.

Third Embodiment

Figure 5:
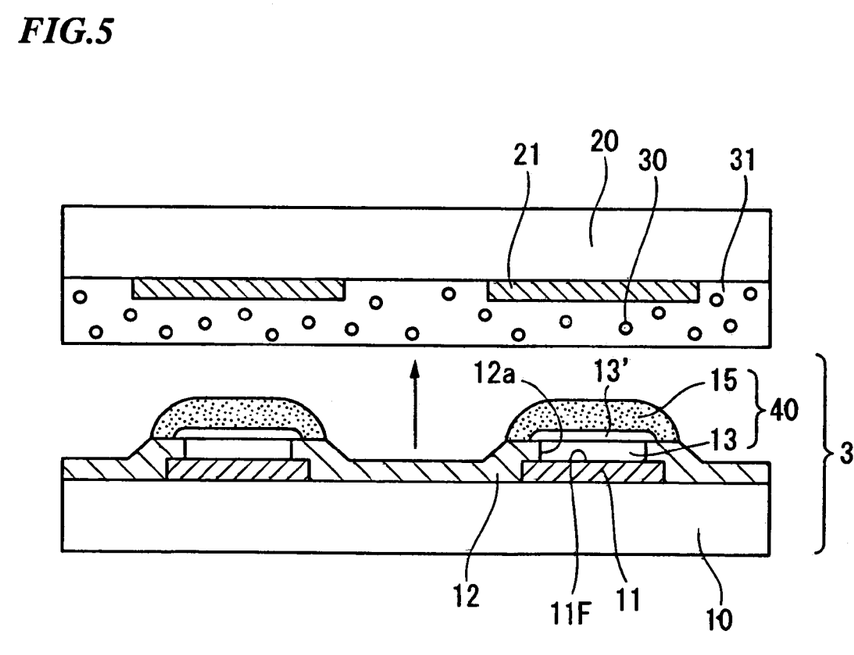
FIG. 5 is a schematic cross-sectional view schematically illustrating a semiconductor chip according to a third embodiment of the present invention.

FIG. 5 is a cross-sectional view of a semiconductor device according to a third embodiment of the present invention. As shown in FIG. 5, a third conductive layer 13' which is softer than the first conductive layer 13 may be provided between the first conductive layer 13 and the second conductive layer 15. In this embodiment, the first conductive layer 13 is made of nickel (Ni) and the third conductive layer 13' is made from gold (Au) which is a softer metal than nickel. The third conductive layer 13' may reduce damage (silicon cracks) to the substrate 10 which is located below the outer-connection electrodes 11 during bonding. The third conductive member 13' made of gold may prevent oxidation of the first conductive layer 13 and the like. The third conductive member 13' also serves as a catalyst in the above-described embodiments.

In the embodiments mentioned above, the thickness of an outer-connection electrode 11 which is provided within an opening 12a of a passivation film 12 is preferably 0.2 μm or more. Since the outer-connection electrodes 11 made of aluminum (Al) have a sufficient thickness, damage (silicon cracks) to the substrate 10 which is located below the outer-connection electrodes 11 during bonding may be reduced.

Figure 6:
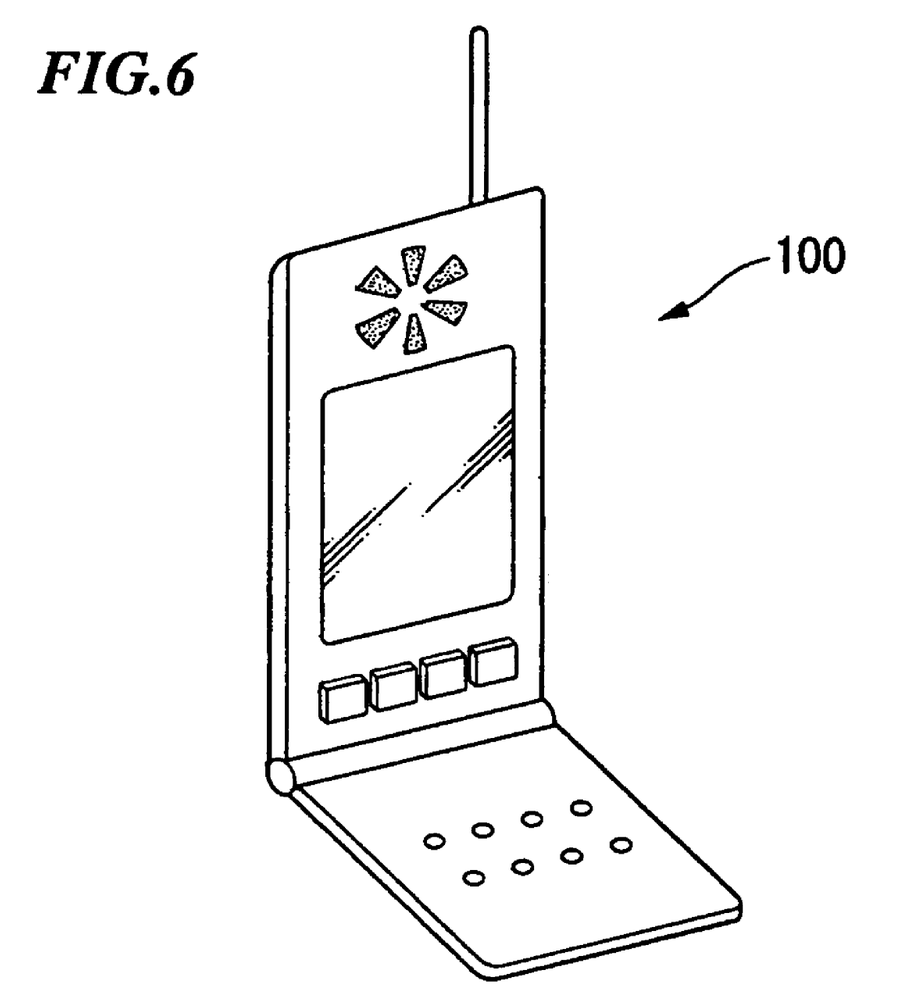
FIG. 6 is a perspective view schematically illustrating an electronic apparatus according to an embodiment of the present invention.

In FIG. 6, a cellular phone 100 is shown as a example of an electronic apparatus having the semiconductor device according to this embodiment. The semiconductor device shown in FIG. 2 is mounted in a casing of such electronic apparatuses.

The electronic apparatus is not limited to IC cards or cellular phones, and the present invention may be applied to various electronic apparatuses. For example, the present invention may be applied to a wide range of electronic apparatuses, including notebook-type personal computers, personal digital assistances (PDAs), electronic organizers, electronic desk calculators, liquid crystal projectors, printers, and the like.

While preferred embodiments of the invention have been described and illustrated above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a semiconductor chip including:
      a substrate,
      an outer-connection electrode,
      an insulating layer which is provided on the substrate and has an opening formed on the outer-connection electrode so as to expose a part of the outer-connection electrode, and
      a bump having a first conductive layer on the outer-connection electrode and a second conductive layer covering the first conductive layer, the first conductive layer being made of nickel and the second conductive layer being made of copper; and;
   a wiring board having a land and an insulating material containing dispersed conductive particles, provided on the wiring board, wherein:
   an electrical connection is established by the conductive particles penetrating into both the second conductive layer and the land; and
   the thickness of the second conductive layer is selected so that a depth of penetration of the conductive particles into the second conductive layer is a quarter or more of a particle size of the conductive particles.

2. The semiconductor device according to claim 1, wherein a catalyst is disposed between the first conductive layer and the second conductive layer.

3. The semiconductor device according to claim 1, further comprising a passivation film which is formed on the substrate and has an opening in the outer-connection electrode, wherein the first conductive layer is formed within the opening, and has a thickness of equal to or less than a thickness of the passivation film.

4. The semiconductor device according to claim 1, wherein the first conductive layer is made of a material having a same hardness as the conductive particles or a higher hardness than the conductive particles.

5. The semiconductor device according to claim 1, wherein the conductive particles contain a material having a higher hardness than copper of which the second conductive layer is made.

6. A semiconductor device comprising:
   a semiconductor chip including:
      a substrate,
      an outer-connection electrode,
      an insulating layer which is provided on the substrate and has an opening formed on the outer-connection electrode so as to expose a part of the outer-connection electrode, and
      a bump having a first conductive layer on the outer-connection electrode and a second conductive layer covering the first conductive layer, the first conductive layer being made of nickel and the second conductive layer being made of copper; and
   a wiring board having a land and an insulating material containing dispersed conductive particles provided on the wiring board; wherein:
   an electrical connection is established by the conductive particles penetrating into both the second conductive layer and the land; and
   the thickness of the second conductive layer is selected so that a depth of penetration of the conductive particles into the second conductive layer is a half or more of a particle size of the conductive particles so that the bump and the land directly contact each other.

7. The semiconductor device according to claim 6, wherein a catalyst is disposed between the first conductive layer and the second conductive layer.

8. The semiconductor device according to claim 6, further comprising a passivation film which is formed on the substrate and has an opening in the outer-connection electrode, wherein the first conductive layer is formed within the opening, and has a thickness of equal to or less than a thickness of the passivation film.

9. The semiconductor device according to claim 6, wherein the first conductive layer is made of a material having a same hardness as the conductive particles or a higher hardness than the conductive particles.

10. The semiconductor device according to claim 6, wherein the conductive particles contain a material having a higher hardness than copper of which the second conductive layer is made.

* * * * *